United States Patent
Lee et al.

(10) Patent No.: US 6,596,830 B2
(45) Date of Patent: Jul. 22, 2003

(54) SILICON-CONTAINING POLYMER AND BILAYER RESIST COMPOSITION BASED THEREON

(75) Inventors: Haiwon Lee, Seongnam (KR); Sung Soo Kim, Gangdong-Gu (KR)

(73) Assignee: Hanyang Hak Won Co., LTD, Seoul (KR)

( * ) Notice: Subject to any disclaimer, the term of this patent is extended or adjusted under 35 U.S.C. 154(b) by 0 days.

(21) Appl. No.: 10/144,110

(22) Filed: May 10, 2002

(65) Prior Publication Data
US 2002/0173609 A1 Nov. 21, 2002

(30) Foreign Application Priority Data
May 11, 2001 (KR) ..................... 2001-0025960

(51) Int. Cl.[7] ............................... C08F 34/02
(52) U.S. Cl. ..................................... 526/266
(58) Field of Search ................. 526/270, 279, 526/320, 328.5; 430/270.1

(56) References Cited

U.S. PATENT DOCUMENTS 6,444,408 B1 * 9/2002 Brock et al. ................. 430/322

FOREIGN PATENT DOCUMENTS

| JP | 2001-278918 | * 10/2001 |
| JP | 2002-91005 | * 3/2002 |

* cited by examiner

Primary Examiner—Helen L. Pezzuto
(74) Attorney, Agent, or Firm—Brown, Martin, Haller & McClain, LLP

(57) ABSTRACT

Polymeric compounds for use in a chemically amplified resist are represented by the following chemical formulas 1 and 2:

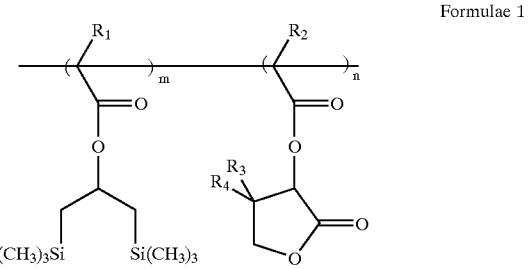

Formulae 1 wherein $R_1$ and $R_2$, which may be identical or different, are each selected from the group consisting of —H and —CH$_3$; $R_3$ and $R_4$, which may be identical or different, are each selected from the group consisting of —H, —CH$_3$ and —CH$_2$CH$_3$; and $0.1 \leq m \leq 0.9$ and $0.1 \leq n \leq 0.9$, with the equation of m+n=1.

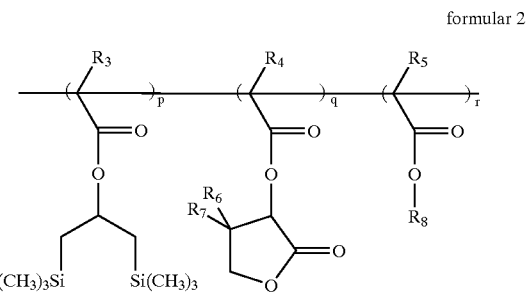

formular 2 wherein $R_3$, $R_4$, and $R_5$, which may be identical or different, are each selected from the group consisting of —H and —CH$_3$; $R_6$ and $R_7$, which may be identical or different, are each selected from the group consisting of —H, —CH$_3$ and —CH$_2$CH$_3$; $R_8$ is —CH$_3$ or —CH$_2$CH$_2$OH; and $0.1 \leq p \leq 0.9$, $0.05 \leq q \leq 0.8$, and $0.05 \leq r \leq 0.5$, with the equation of p+q+r=1.

6 Claims, 4 Drawing Sheets

SILICON-CONTAINING POLYMER AND BILAYER RESIST COMPOSITION BASED THEREON

BACKGROUND OF THE INVENTION

1. Field of the Invention

The present invention relates to a silicon-containing polymer and a chemically amplified bilayer resist composition. More particularly, the present invention relates to a chemically amplified bilayer resist composition for use in a broad range of microlithography, including ArF lithography, electron beam lithography, etc., which performs well in terms of adhesion to Si substrates, exposure and development, and dry etch resistance.

2. Description of the Prior Art

In the electronics industry, the high degree of integration in circuits requires fine patterns, making the fabrication process of semiconductor devices highly complicated. Accordingly, novel resists have been in great demand for use in optical lithography.

Conventional resist materials are incapable for ArF lithography because of their poor transparency at 193 nm wavelength. As the capacity of semiconductor devices exceed 4 G bit, it is necessary to develop a new resist material for ArF excimer laser lithography with high optical transparency at the exposure wavelength.

For example, 4G bit or larger scaled semiconductor devices can be achieved by the microlithography using ArF eximer laser as a light source, whose wavelength (193 nm) demands novel resists different from those used for the microlithography using longer wavelengths.

ArF resists may be classified into two types by their fabrication processes: single layer resist (SLR) and bi-layer resist (BLR). The SLR allows the formation of resist patterns to be achieved easily; however, it cannot guarantee sufficient dry etch resistance on the resist patterns formed therefrom. Additionally, when its aspect ratios are increased, the SLR pattern formations are apt to collapse, which makes it difficult to establish the patterns. By contrast, when the BLR, which contains silicon, is used to form resist patterns, intricate processes are required.

However, since the silicon atoms in the resists crystallize into glass upon dry etching with $O_2$ plasma, to form a hard layer at the surface of the resist, the BLR allows for the easy formation of resist patterns even at large aspect ratios.

Serving as an important factor in preparing the BLR, the content of silicon in the BLR is required to amount to be equal to or greater than 10% by weight in order to secure sufficient aspect ratios. Silicon-containing polymers, available as BLR for use in ArF excimer laser lithography, are described in J. Photopolymer Science and Technology, No. 4, Vol.8, p.615 1995, Akiko Kotachi, et al., "Si-Containing Positive Resist for ArF Excimer Laser Lithography."

The polymers disclosed in the literature contain silicon in an amount of 8% by weight which is too small to guarantee sufficient aspect ratios. Additionally, these polymers adhere poorly in terms of adhesion to substrates that the resist films prepared therefrom are apt to separate from their substrates.

U.S. patent application Ser. No. 08/942,249, filed September 1999 by the present inventors, discloses a BLR which is prepared using a 1,3-bis(trimethylsilyl)isopropyl methacrylate (BPMA) as a silicon-containing monomer. With an acid moiety having an unstable group, the BPMA monomer can be very useful for the preparation of BLR. Resists using the monomer disclosed by the present inventors in the following publication: e.g., J. Photopolymer Science and Technology, No. 4, Vol. 10, 1997, Kang, Y. J., Lee, H. et al.; Chemically Amplified Silicon Containing Resist for ArF Excimer Laser Lithography, p.585; Mol. Cryst. Liq. Cryst., 1999, 327, Kim, Y. D., Lee, H, et al.; New Bilayer Positive Photoresists for 193 nm Photolithography, p.279; Korean Patent. Publication No. 10-1999-230417, issued Dec. 15, 1999 to the present inventors.

Although easily formable form into patterns as fine as 1 $\mu$m or less, the resists disclosed in the above literature cannot be used in practice because they are not developed at the required solution's concentration in microlithography processes (e.g. 2.38 wt % TMAH).

SUMMARY OF THE INVENTION

With the above problems in mind, it is an object of the present invention to provide copolymers of novel structures, which show good enough transmittance at 193 nm wavelength in using ArF excimer laser lithography, contain a silicon content sufficient for use in BLR, and are capable of being developed in 2.38 wt % TMAH (tetramthyl ammonium hydroxide) solution.

It is another object of the present invention to provide polymers which are improved in etch resistance and perform very well in terms of adhesion to substrates.

It is a further object of the present invention to provide chemically amplified resist compositions containing the copolymers.

DETAILED DESCRIPTION OF THE INVENTION

Figure 1:
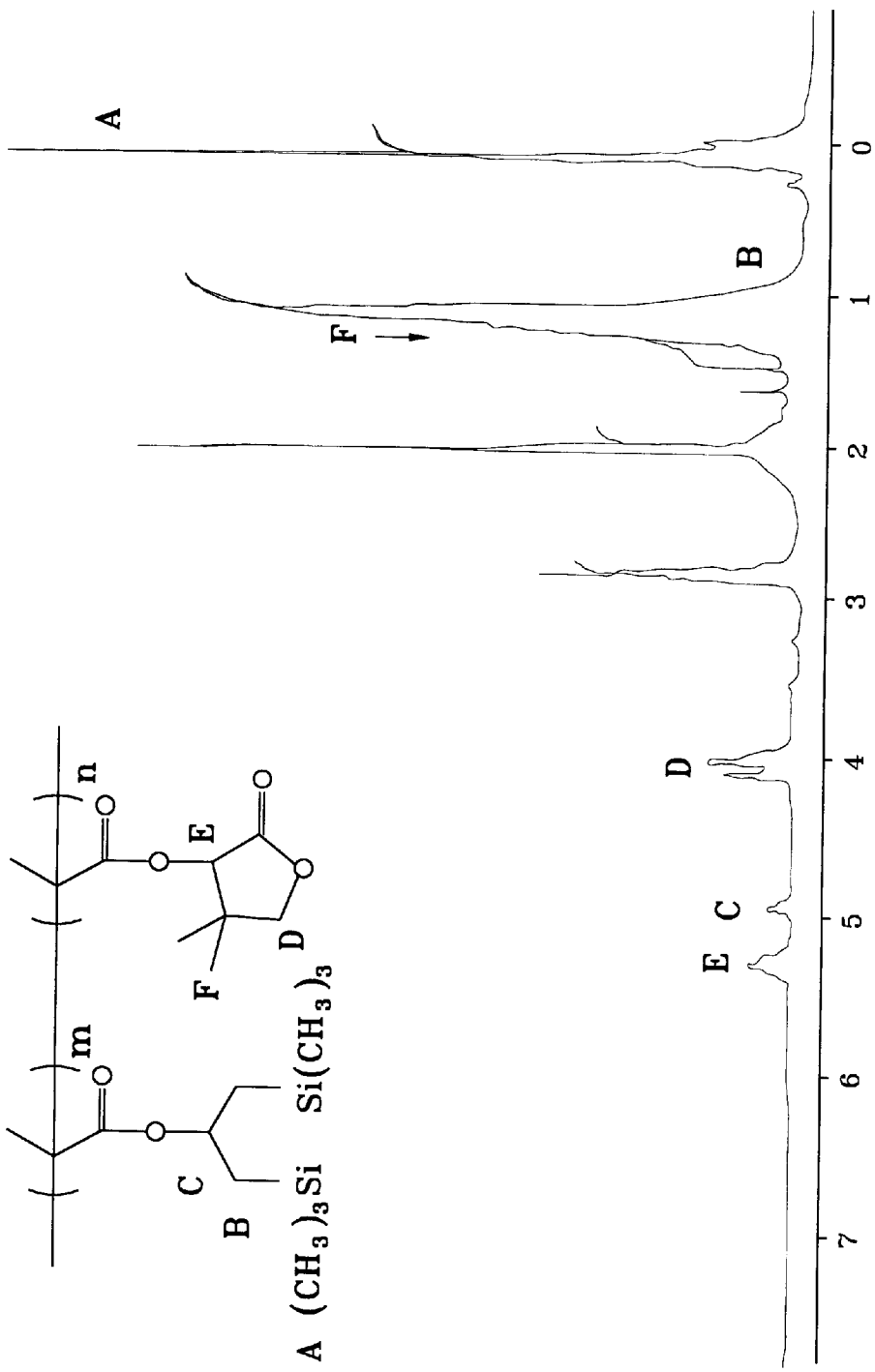
FIG. 1 is an $^1$H-NMR spectrum of a copolymer prepared according to the present invention.

The present invention provides a copolymer represented by the following chemical formula 1:

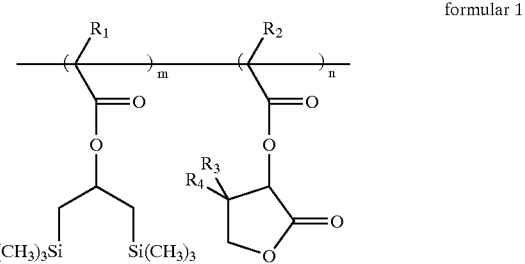

formular 1 wherein $R_1$ and $R_2$, which may be identical or different, are each selected from the group consisting of —H and —$CH_3$; $R_3$ and $R_4$, which may be identical or different, are each selected from the group consisting of —H, —$CH_3$ and —$CH_2CH_3$; and $0.1 \leq m \leq 0.9$ and $0.1 \leq n \leq 0.9$, with the proviso of m+n=1. The copolymer has a weight average molecular weight range of 5,000 to 100,000.

The present invention also provides a terpolymer represented by the following chemical formula 2:

formular 2

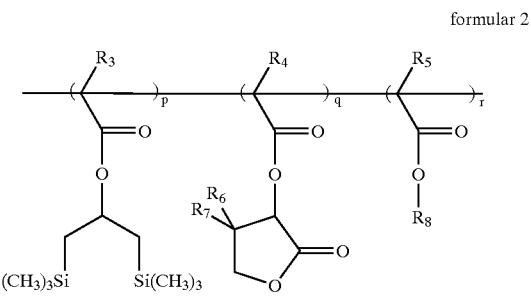

wherein $R_3$, $R_4$, and $R_5$, which may be identical or different, are each selected from the group consisting of —H and —$CH_3$; $R_6$ and $R_7$, which may be identical or different, are each selected from the group consisting of —H, —$CH_3$ and —$CH_2CH_3$; $R_8$ is —$CH_3$ or —$CH_2CH_2OH$; and $0.1 \leq p < 0.9$, $0.05 \leq q \leq 0.8$, and $0.05 \leq r \leq 0.5$, with the equation of $p+q+r=1$. This terpolymer has a weight average molecular weight range of 5,000 to 100,000.

Having generally described this invention, reference to certain specific examples are provided herein for purposes of illustration only and are not intended to be limitive unless specified otherwise.

Synthesis Example 1

The BPMA monomer for polymers of chemical formulas 1 and 2 was synthesized through the pathway shown in the following reaction schemes 1 and 2:

Scheme 1

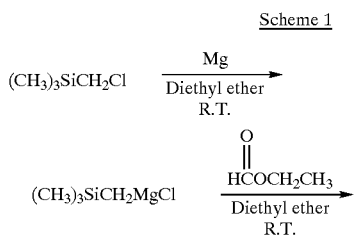

Scheme 2

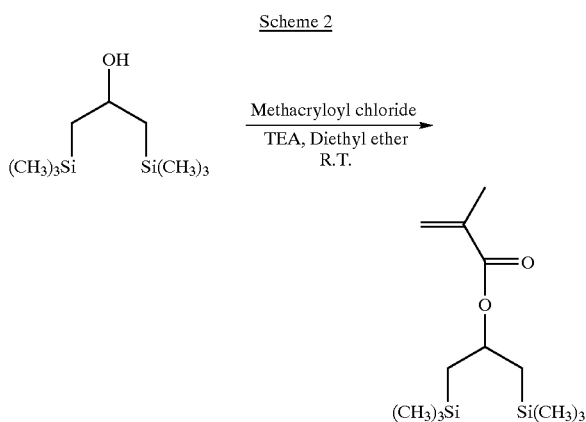

(1) Synthesis of 1,3-bis(trimethylsilyl)-2-propanol (BPOH) (II)

0.3 molar solution of magnesium powder was added to anhydrous diethyl ether in a 500 mL three-necked flask equipped with a reflux ether and a dropping funnel. Chloromethyltrimethylsilane was dropped slowly via the dropping funnel while being stirred in a nitrogen atmosphere. By allowing the reactants to react for about 6 hours, the Grignard reagent (trimethylsilylmethyl magnesium chloride) (I) was obtained. 0.15 molar solution of ethyl formate was added to the Grignard agent, followed by reaction for 24 hours, with stirring. The solution was then hydrolyzed by pouring the saturated ammonium chloride aqueous solution and extracted with diethyl ether. The organic layer thus separated was washed with distilled water several times and dried over magnesium sulfate, after which the solvent was removed using a rotary evaporator. The product was purified by vacuum distillation and found to boil at 35° C. under 1 torr. The yield was 70%. The product was analyzed for structure by $^1$H-NMR (Nuclear Magnetic Resonance) and FT-IR (Fourier Transform Infrared Radiation) spectrophotometers.

$^1$H-NMR(Acetone-$d_6$, ppm): 0.0(18H, Si—$CH_3$), 0.9(4H, —$CH_2$—), 1.2(1H, —OH), 4.0(1H, —CH—) FT-IR(KBr, cm$^{-1}$): 3300(—OH), 2950(C—H), 1400 and 1260(Si—H)

(2) Synthesis of 1,3-bis(trimethylsilyl)isopropyl Methacrylate (BPMA) (III)

0.1 mole of the BPOH (II) synthesized above and 0.15 moles of TEA (triethylamine) were dissolved in anhydrous diethyl ether in a 250 mL flask. 0.1 mole of methacryloyl chloride was added slowly to the solution. Following the reaction of the reactants stirred for 24 hours, the solution was extracted with diethyl ether. The extract was dried over anhydrous magnesium sulfate and the solvent was removed using a rotary evaporator. The product thus obtained was purified by vacuum distillation and found to have a boiling point of 45° C. at 1 torr. The examination of the product for its structure was done using $^1$H-NMR (Nuclear Magnetic Resonance) and FT-IR (Fourier Transform Infrared Radiation) spectrophotometers.

$^1$H-NMR(Acetone-$d_6$, ppm): 0.0(18H, Si—$CH_3$), 1.0(4H, —$CH_2$—), 1.9(3H, —$CH_3$), 5.2(1H, —CH—), 5.5 6.0(2H, =$CH_2$) FT-IR(KBr, cm$^{-1}$): 2950(C=H), 1720(C=O), 1600(C=C), 1400 and 1260(Si—H)

Synthesis Example 2

The PLMA (pantolactone methacrylate) monomer (V) for polymers of chemical formulas 1 and 2 was synthesized through the pathway shown in the following reaction scheme 3:

Scheme 3

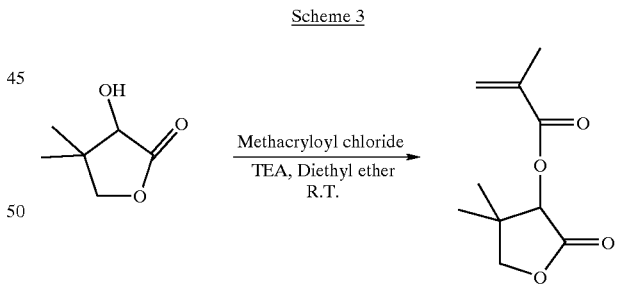

0.1 mole of pantolactone (IV) and 0.15 moles of TEA were dissolved in anhydrous methylene chloride in a 250 mL flask, followed by the slow addition of 0.1 mole of methacryloly chloride in a nitrogen atmosphere. The mixture was stirred and subjected to reaction for about 24 hours. The mixture was extracted with diethyl ether, and the extract was dried over anhydrous magnesium sulfate. Following the removal of the solvent by use of a rotary evaporator, the product was purified by column chromatography. The product was analyzed for its structure by $^1$H-NMR.

$^1$H-NMR(Acetone-$d_6$, ppm): 1.1(6H, —$CH_3$), 1.9(3H, —$CH_3$), 4.1(2H, —$CH_2$—), 5.4(1H, —CH—), 5.7 and 6.2(2H,=$CH_2$)

Synthesis Example 3

Synthesis of Copolymer (VI)

Poly[bis(trimetylsilyl)isopropyl methacrylate-co-pantolactone methacrylate](VI) was synthesized as represented by the following reaction scheme 4:

Scheme 4

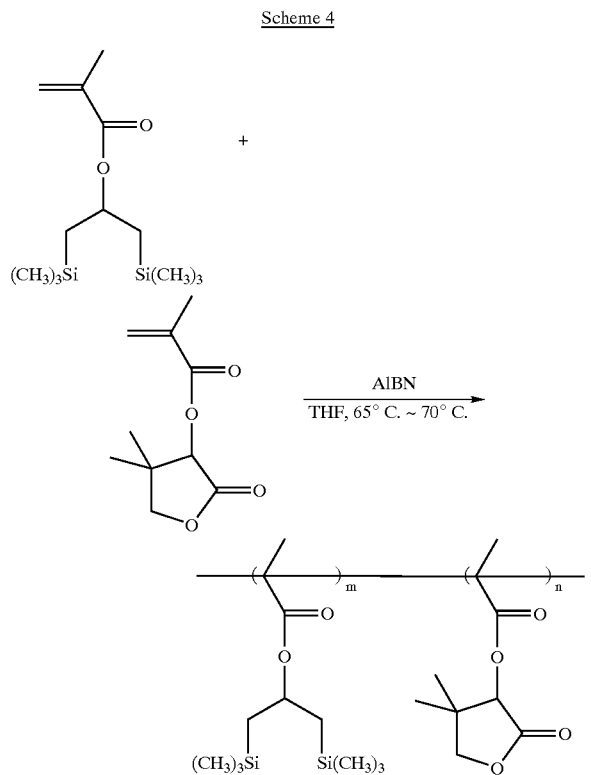

In a 500 mL flask, 0.1 mole of BPMA monomer (III), prepared in Synthesis Example 1, was dissolved, together with 0.1 mole of PLMA monomer (V), prepared in Synthesis Example 2, in THF (tetrahydrofuran), followed by purgation with nitrogen gas for 30 minute. The monomers were polymerized at 65–70° C. for 24 hours in a nitrogen atmosphere. The solution was subjected to precipitation in excess n-hexane, and the precipitate was dissolved in THF and re-precipitated in n-hexane. After filtration through filter paper, the precipitate was dried for 24 hours in a vacuum oven maintained at about 45° C. to produce the polymer (VI) at a yield of 70%. The polymer (VI) was found to have a weight average molecular weight of 25,000, a polydispersity of 1.6 and an Si content of 12% by weight (calculated).

Figure 2:
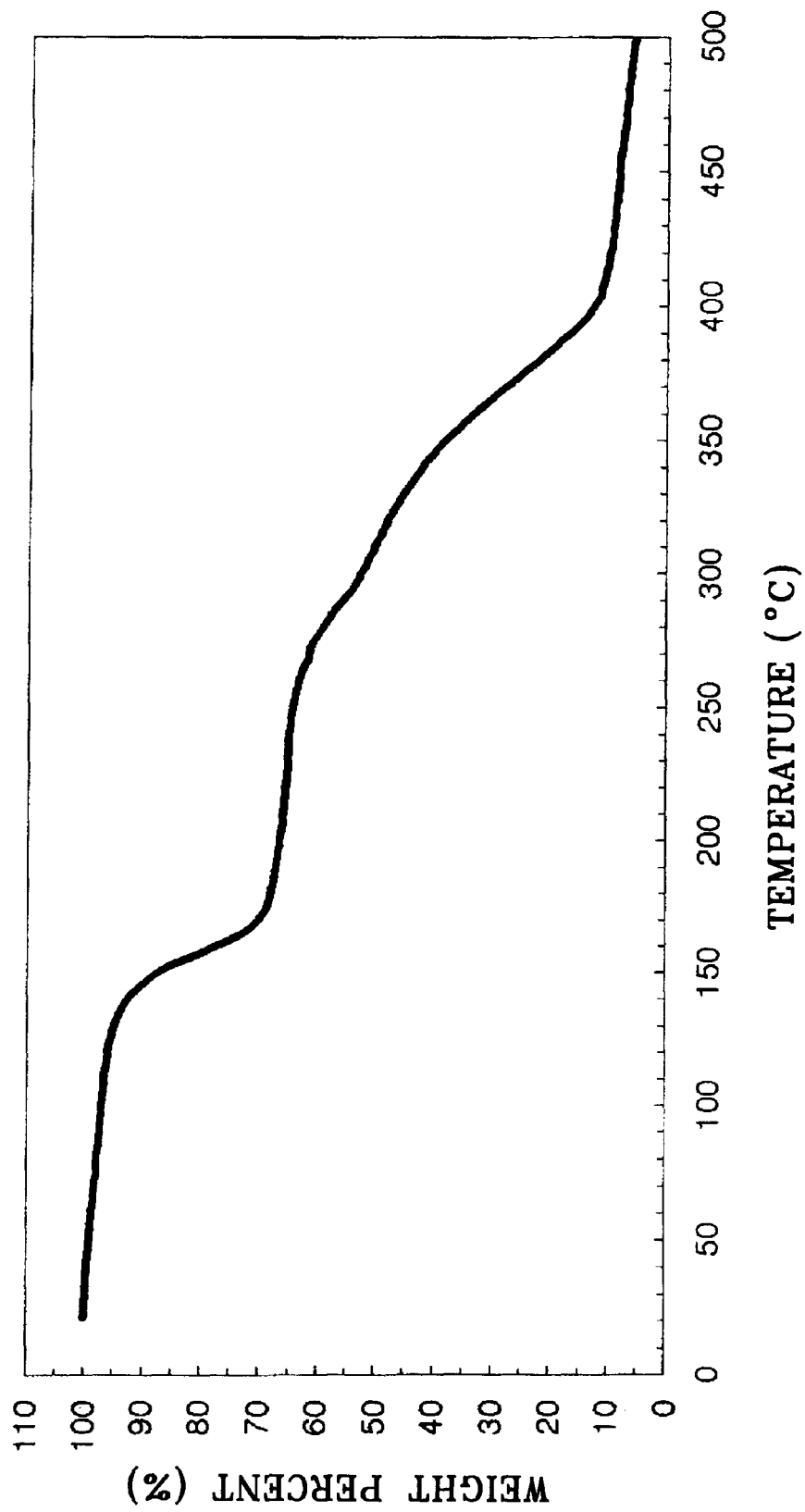
FIG. 2 is a TGA thermogram of a copolymer prepared according to the present invention.

The copolymer (VI) was analyzed for structure by $^1$H-NMR and for thermal stability by TGA (thermo gravimetric analysis), and the results are provided in FIGS. 1 and 2, respectively.

Synthesis Example 4

Synthesis of Terpolymer (VIII)

Poly[bis(trimethylsilyl)isopropyl methacrylate-co-pantolactone methacrylate-co-2-hydroxyethyl methacrylate] (VIII) was synthesized through the pathway shown in the following reaction scheme 5:

Scheme 5

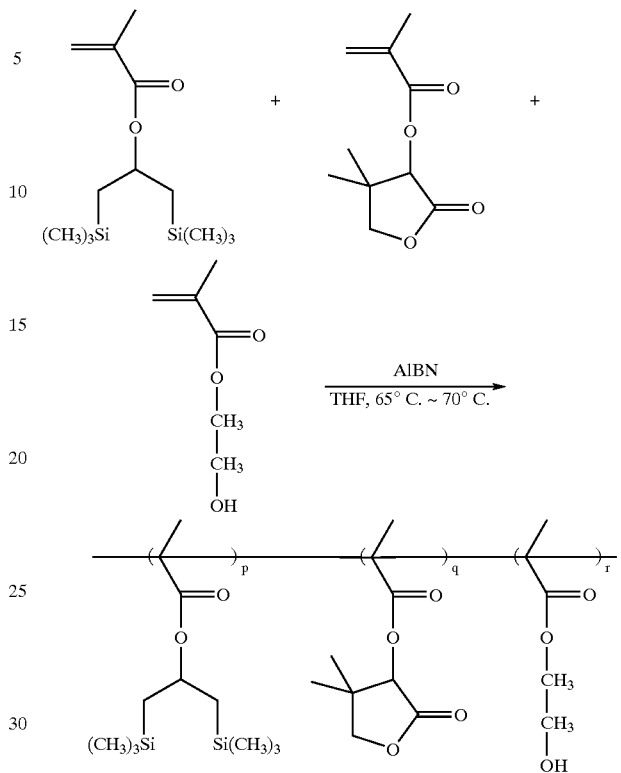

In a 500 mL flask, 0.1 mole of BPMA monomer (III) prepared in Synthesis Example 1, 0.08 moles of PLMA monomer (V) prepared in Synthesis Example 2, and 0.02 moles of 2-hydroxyethyl methacrylate (VII) were dissolved, together with 1 mol % of AIBN, in THF (tetrahydrofuran), followed by purgation with nitrogen gas for 30 minutes. The reactants were polymerized at 65–70° C. and stirred for 24 hours in a nitrogen atmosphere. The solution was subjected to precipitation in excess n-hexane, and the precipitate was dissolved in THF and re-precipitated in n-hexane. After filtration through filter paper, the precipitate was dried for about 24 hours in a vacuum oven maintained at about 45° C. to produce the polymer (VIII) at a yield of 50%. The polymer (VI) was found to have a weight average molecular weight of 15,000, a polydispersity of 1.8 and a Si content of 12% by weight (calculated).

Figure 3:
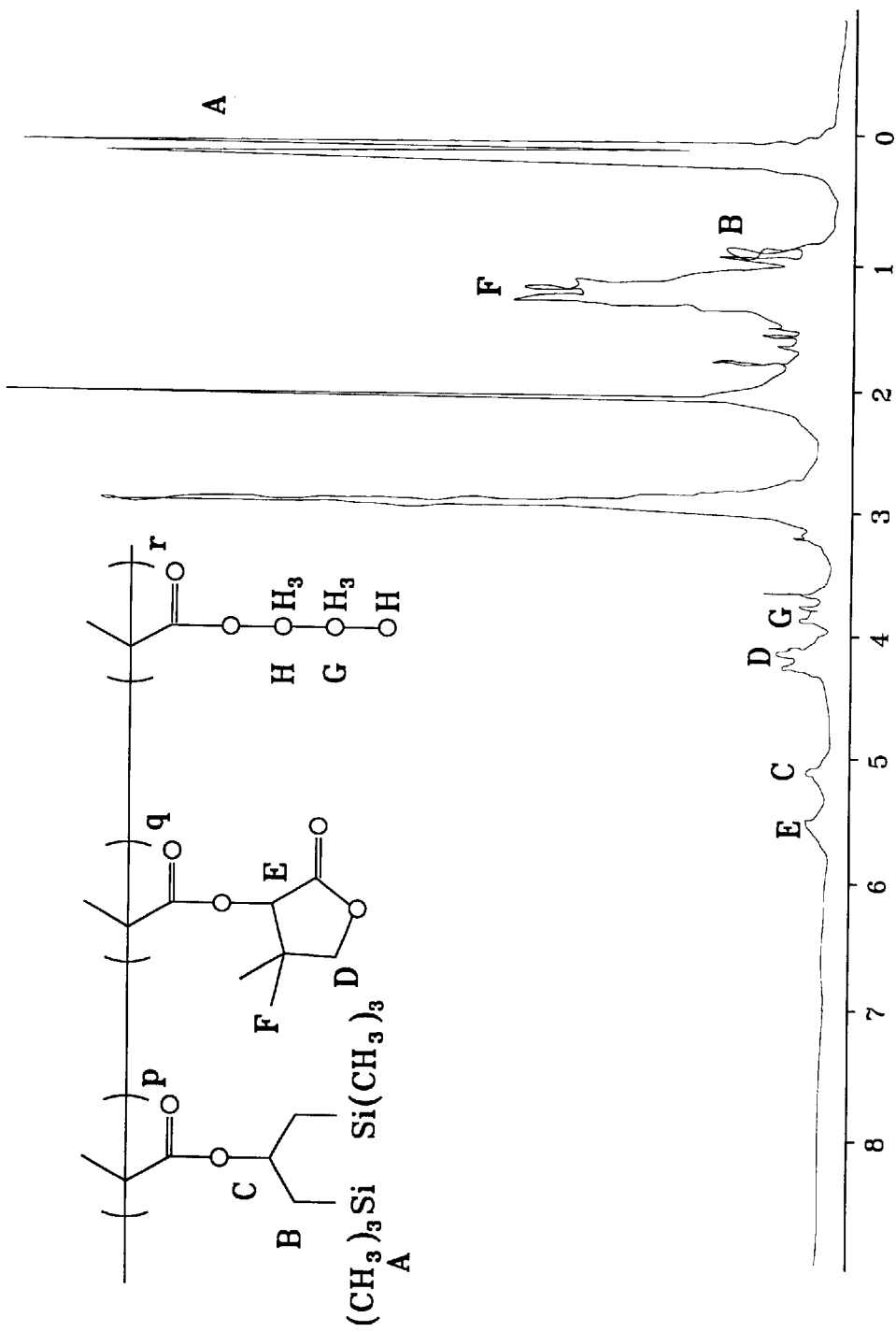
FIG. 3 is an $^1$H-NMR spectrum of a terpolymer prepared according to the present invention.
Figure 4:
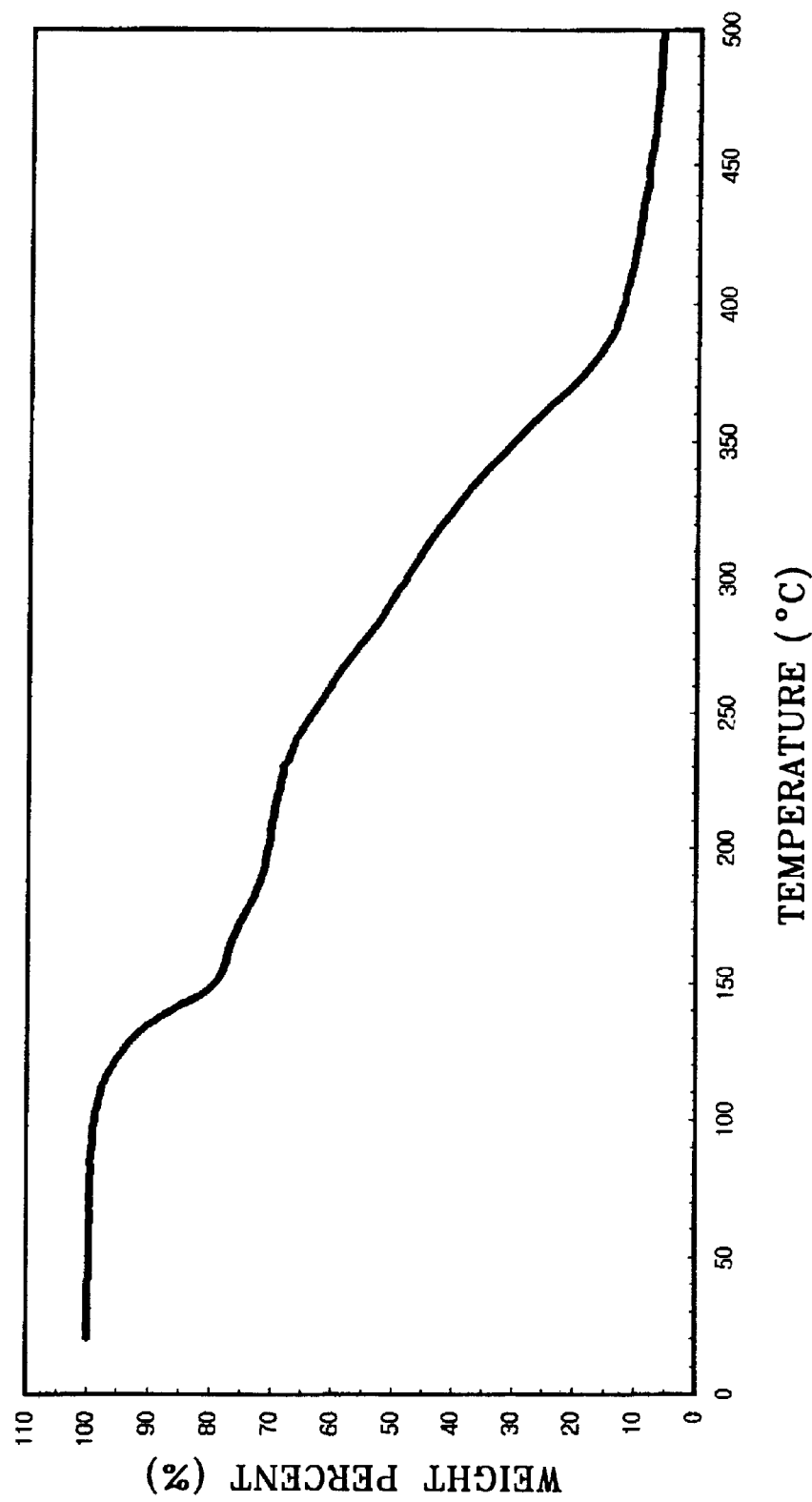
FIG. 4 is a TGA thermogram of a terpolymer prepared according to the present invention.

The terpolymer (VI) was analyzed for structure by $^1$H-NMR and for thermal stability by TGA (thermogravimetric analysis), and the results are provided in FIGS. 3 and 4, respectively.

EXAMPLE 1

2 g of the copolymer (VI) synthesized in Synthesis Example 3 and 0.02 g (50 μmoles) of triarylsulfonium triflate as a photoacid generator (PAG) were completely dissolved in 16 g of propyleneglycol methylether acetate with the aid of a stirrer. The solution was filtered through 0.45 μm and 0.2 μm membrane filters. The filtrate thus obtained was spin-coated onto a silicon wafer treated with hexamethyldisilazane (HMDS) at about 3,000 rpm and soft-baked for 60 seconds on a plate maintained at about 75° C. to form a resist layer about 0.3 μm thick. The wafer coated with the resist composition was exposed at a dose of about 56 mJ/cm$^2$ with the aid of an ArF excimer laser stepper (NA=0.6), followed by PEB (post-exposure bake) at about 120° C. for 60 seconds. Development with a 2.38 wt % TMAH solution (NMD-3) for 60 seconds resulted in clear line and space patterns with a resolution of 0.3 μm or less.

EXAMPLE 2

2 g of the terpolymer (VIII) synthesized in Synthesis Example 4 and 0.02 g (50 μmoles) of triarylsulfonium triflate as a photoacid generator (PAG) were completely dissolved in 16 g of prolyleneglycol methylether acetate with the aid of a stirrer. The solution was filtered through 0.45 μm and 0.2 μm membrane filters. The filtrate thus obtained was spin-coated onto a silicon wafer treated with HMDS at about 2,500 rpm and soft-baked for 60 seconds on a plate maintained at about 75° C. to form a resist layer about 0.3 μm thick. The wafer coated with the resist composition was exposed at a dose of about 56 mJ/cm² with the aid of an ArF excimer laser stepper (NA=0.6), followed by PEB at about 120° C. for 60 seconds. Development with a 2.38 wt % TMAH solution (NMD-3) for 60 seconds resulted in clear line and space patterns with a resolution of 0.3 μm or less.

As described hereinbefore, the copolymer and terpolymer, represented by the chemical formulas 1 and 2, respectively, contain silicon in amounts sufficient for the production of ArF bilayer resists, in addition to performing very well in terms of adhesion to substrates. Further, with high development properties with 2.38 wt % TMAH, the resist composition of the present invention allows for resist patterns with a resolution as fine as 0.3 μm or less, and thus can be very useful for the fabrication of high capacity semiconductor devices.

The present invention has been described in an illustrative manner, and it is to be understood that the terminology used is intended to be in the nature of a description rather than of a limitation. Many modifications and variations of the present invention are possible in light of the above teachings. Therefore, it is to be understood that within the scope of the appended claims, the invention may be practiced in other ways than as specifically described.

We claim:

1. An acrylate-based copolymer having a weight average molecular weight range of 5,000–100,000, represented by the following chemical formula 1:

formular 1

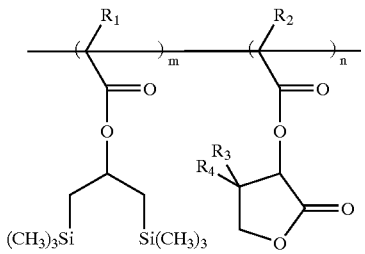

wherein $R_1$ and $R_2$, which may be identical or different, are each selected from the group consisting of —H and —CH$_3$;

$R_3$ and $R_4$, which may be identical or different, are each selected from the group consisting of —H, —CH$_3$ and —CH$_2$CH$_3$; and $0.1 \leq m \leq 0.9$ and $0.1 \leq n \leq 0.9$, with the equation of m+n=1.

2. A resist composition, comprising the acrylate-based copolymer of claim 1, and a photoacid generator in an amount of 0.5–20 parts by weight based on 100 parts by weight of the acrylate-based copolymer.

3. The resist composition as set forth in claim 2, wherein the photoacid generator is selected from the group consisting of triarylsulfonium salts, diaryliodonium salts, sulfonates, and mixtures thereof.

4. An acrylate-based terpolymer having a weight average molecular weight range of 5,000–100,000, represented by the following chemical formula 2:

formular 2

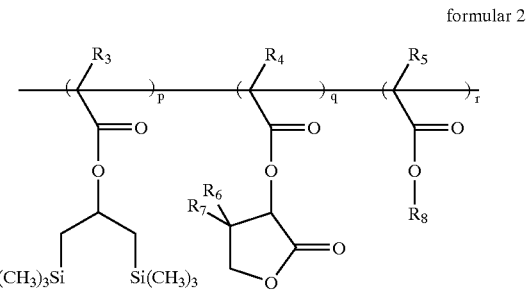

wherein, $R_3$, $R_4$, and $R_5$, which may be identical or different, are each selected from the group consisting of —H and —CH$_3$;

$R_6$ and $R_7$, which may be identical or different, are each selected from the group consisting of —H, —CH$_3$ and —CH$_2$CH$_3$; $R_8$ is —CH$_3$ or —CH$_2$CH$_2$OH; and $0.1 \leq p \leq 0.9$, $0.05 \leq q \leq 0.8$, and $0.05 \leq r \leq 0.5$, with the equation of p+q+r=1. This terpolymer preferably ranges, in weight average molecular weight, from 5,000 to 100,000.

5. A resist composition, comprising the acrylate-based copolymer of claim 4, and a photoacid generator in an amount of 0.5–20 parts by weight based on 100 parts by weight of the acrylate-based copolymer.

6. The resist composition as set forth in claim 5, wherein the photoacid generator is selected from the group consisting of triarylsulfonium salts, diaryliodonium salts, sulfonates, and mixtures thereof.

* * * * *